United States Patent
Hsueh et al.

(10) Patent No.: US 9,076,572 B2
(45) Date of Patent: Jul. 7, 2015

(54) CONDUCTIVE PASTE

(71) Applicant: Chi Mei Corporation, Tainan (TW)

(72) Inventors: Chan-Li Hsueh, Tainan (TW); Chung-Ping Li, Tainan (TW); Chu-Yun Cheng, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 14/221,276

(22) Filed: Mar. 20, 2014

(65) Prior Publication Data

US 2014/0326929 A1 Nov. 6, 2014

(30) Foreign Application Priority Data

May 6, 2013 (TW) .............................. 102116108 A
Oct. 25, 2013 (TW) .............................. 102138743 A

(51) Int. Cl.
*H01B 1/22* (2006.01)
*H05K 3/12* (2006.01)

(52) U.S. Cl.
CPC ................. *H01B 1/22* (2013.01); *H05K 3/1283* (2013.01)

(58) Field of Classification Search
CPC ............ H01B 1/22; H01B 1/02; H01B 1/026; H01B 1/12; H05K 3/1283

USPC .................. 252/500, 512, 514, 518.1, 519.2, 252/519.21

See application file for complete search history.

(56) References Cited

U.S. PATENT DOCUMENTS

| | | | |
|---|---|---|---|
| 7,588,698 B2 * | 9/2009 | Toshioka et al. ............. | 252/500 |
| 2008/0261049 A1 * | 10/2008 | Hayashi et al. ............... | 428/418 |
| 2009/0127518 A1 * | 5/2009 | Nagano et al. ................ | 252/514 |
| 2011/0140162 A1 * | 6/2011 | Okada et al. .................. | 257/99 |

FOREIGN PATENT DOCUMENTS

| | | |
|---|---|---|
| TW | 200804557 | 1/2008 |
| TW | 201241146 | 10/2012 |
| WO | 2012102304 | 8/2012 |

OTHER PUBLICATIONS

"Office Action of Taiwan Counterpart Application," issued on Dec. 9, 2014, p. 1-p. 8.

* cited by examiner

*Primary Examiner* — Harold Pyon
*Assistant Examiner* — Matthew R Diaz
(74) *Attorney, Agent, or Firm* — Jiang Chyun IP Office

(57) ABSTRACT

A conductive paste is provided, which includes 3 wt % to 20 wt % of epoxy resin, 10 wt % to 25 wt % of solvent, 0.3 wt % to 5 wt % of latent curing agent, 3.5 wt % to 35 wt % of flaky metal powder surface-treated by saturated fatty acid, and 35 wt % to 75 wt % of flaky metal powder surface-treated by unsaturated fatty acid.

13 Claims, No Drawings

CONDUCTIVE PASTE

CROSS-REFERENCE TO RELATED APPLICATION

This application claims the priority benefits of Taiwan application serial no. 102116108, filed on May 6, 2013, and Taiwan application serial no. 102138743, filed on Oct. 25, 2013. The entirety of each of the above-mentioned patent applications is hereby incorporated by reference herein and made a part of specification.

BACKGROUND OF THE INVENTION

1. Field of the Invention

The invention relates to a conductive composition, and more particularly, to a conductive paste.

2. Description of Related Art

A conductive paste containing a metal powder of, for instance, silver, has good conductivity, and therefore can be widely applied in the parts of various electronic machines to form a conductive wiring. In recent years, the conductive wiring has been applied in mobile terminals such as mobile phones and game consoles, and in, for instance, the touch screen panels of personal computers. The linewidth/spacing of the conductive wiring has been reduced in size to 150 μm/150 μm, and the demand for forming a fine pattern having good precision has been rising.

Currently, in the known fabrication process, a screen printing method is generally used to fabricate the conductive wiring. However, in screen printing, the pressing is performed with, for instance, a squeegee to print a conductive paste onto a substrate through a pattern on a screen. That is, the screen printing method performs the pressing with, for instance, a squeegee to bend the screen and to print. Therefore, in comparison to the target linewidth, the linewidth of the printed material obtained by performing screen printing is generally wider, such that the wirings are close to one another. Contact issues or blurring edges of the wirings therefore occur, causing issues such as unclear boundaries.

Moreover, the thixotropic index and the printing characteristics of the known conductive paste are poor, and as a result, the conductive paste has the drawback of dripping immediately after screen printing and is therefore not capable of forming a fine pattern having good precision.

SUMMARY OF THE INVENTION

The invention provides a conductive paste capable of forming a fine pattern having good precision and high conductivity.

The conductive paste of the invention includes an epoxy resin, a solvent, a latent curing agent, a flaky metal powder surface-treated by saturated fatty acid, and a flaky metal powder surface-treated by unsaturated fatty acid. In the conductive paste, the epoxy resin has a content of 3 wt % to 20 wt %, the solvent has a content of 10 wt % to 25 wt %, the latent curing agent has a content of 0.3 wt % to 5 wt %, the flaky metal powder surface-treated by saturated fatty acid has a content of 3.5 wt % to 35 wt %, and the flaky metal powder surface-treated by unsaturated fatty acid has a content of 35 wt % to 75 wt %.

In an embodiment of the invention, the flaky metal powder surface-treated by saturated fatty acid and the flaky metal powder surface-treated by unsaturated fatty acid each independently include silver, copper, or an alloy thereof.

In an embodiment of the invention, each of the flaky metal powder surface-treated by saturated fatty acid and the flaky metal powder surface-treated by unsaturated fatty acid has the average particle diameter D50 of 0.5 μm to 20 μm, the tap density of 1.1 g/cm$^3$ to 5.0 g/cm$^3$, and the specific surface area of 0.5 m$^2$/g to 2.6 m$^2$/g.

In an embodiment of the invention, the epoxy resin includes a solid epoxy resin, a liquid epoxy resin, or a combination thereof.

In an embodiment of the invention, when the solid epoxy resin and the liquid epoxy resin are used in combination, the weight ratio of the solid epoxy resin to the liquid epoxy resin is 9/1 to 1/9.

In an embodiment of the invention, the epoxy equivalent of the solid epoxy resin is 1000 g/eq to 20000 g/eq.

In an embodiment of the invention, the weight-average molecular weight of the solid epoxy resin is 5000 g/mol to 65000 g/mol.

In an embodiment of the invention, the epoxy equivalent of the liquid epoxy resin is 100 g/eq to 1500 g/eq.

In an embodiment of the invention, the weight-average molecular weight of the liquid epoxy resin is 100 g/mol to 3000 g/mol.

In an embodiment of the invention, the boiling point of the solvent is 140° C. to 220° C.

In an embodiment of the invention, an additive is further included, wherein based on 100 parts by weight of the epoxy resin, the content of the additive is 0.1 parts by weight to 30 parts by weight.

In an embodiment of the invention, the additive includes a thixotropic agent, a silane coupling agent, a dispersant, a leveling agent, or a combination thereof.

In an embodiment of the invention, based on 100 parts by weight of the epoxy resin, the content of the silane coupling agent is 0.5 parts by weight to 25 parts by weight.

In an embodiment of the invention, based on 100 parts by weight of the epoxy resin, the content of the leveling agent is 3 parts by weight to 15 parts by weight.

Based on the above, the conductive paste provided in the embodiments of the invention contains a flaky metal powder surface-treated by saturated fatty acid and a flaky metal powder surface-treated by unsaturated fatty acid. As a result, the printing characteristics of the conductive paste are improved, and a fine pattern having good precision can be formed.

To make the above features and advantages of the invention more comprehensible, several embodiments are described in detail as follows.

DESCRIPTION OF THE EMBODIMENTS

To prepare a conductive paste having the advantages of good printing characteristics and high conductivity capable of forming a fine pattern having good precision, the invention provides a conductive paste capable of achieving the advantages. Moreover, the conductive paste provided by the invention can be coated on a substrate (such as a ceramic substrate or a glass substrate) to form a conductive pattern. For instance, in an electronic device, the conductive pattern can be used as a conductive wire. In the following, embodiments are listed as examples of actual implementation of the invention.

The conductive paste of the present embodiment includes an epoxy resin having a content of 3 wt % to 20 wt %, a solvent having a content of 10 wt % to 25 wt %, a latent curing agent having a content of 0.3 wt % to 5 wt %, a flaky metal powder surface-treated by saturated fatty acid having a content of 3.5 wt % to 35 wt %, and a flaky metal powder surface-treated by unsaturated fatty acid having a content of 35 wt % to 75 wt %.

The epoxy resin includes a solid epoxy resin, a liquid epoxy resin, or a combination thereof. In the invention, the terms "solid state" and "liquid state" used refer to the states of the epoxy resin at room temperature (25° C.).

The solid epoxy resin can be in the solid state or close to the solid state at room temperature (25° C.), and can include one or a plurality of functional groups. Moreover, the epoxy equivalent of the solid epoxy resin is, for instance, 1000 g/eq to 20000 g/eq. The "epoxy equivalent" used in the specification refers to the number of grams of a resin containing 1 equivalent epoxy group (g/eq), and is a value determined according to the method specified by JIS K 7236. The weight-average molecular weight of the solid epoxy resin is, for instance, 5000 g/mol to 65000 g/mol.

The solid epoxy resin of the invention includes, for example, a bisphenol epoxy resin, a novolac epoxy resin, an ortho cresol novolac epoxy resin, a multifunctional epoxy resin, amino epoxy resin, a heterocyclic ring-containing epoxy resin, a substituted epoxy resin, a naphthol epoxy resin, and/or derivatives thereof. In one embodiment, the solid epoxy resin preferably is a bisphenol epoxy resin. The solid epoxy resins can be used alone or in a combination of two or more.

Various commercial products can also be used for the solid epoxy resin. Examples of commercial products suitable to be used as the solid epoxy resin include: a bisphenol epoxy resin such as YD-017H, YD-020, YD020-L, YD-014, YD-014ER, YD-013K, YD-019K, YD-019, YD-017R, YD-017, YD-012, YD-011H, YD-011S, YD-011, YDF-2004, and YDF-2001 (Kukdo Chemical Co., Ltd.); BE504H and BE509 (Chang Chun Plastics Co., Ltd.); JER4210, JER4250, JER4275, and JER1256 (Japan Epoxy Resins Co., Ltd.); a novolac epoxy resin such as EPIKOTE 152 and EPIKOTE 154 (Sanho Chemical Co., Ltd.); EPPN-201 (Nippon Kayaku Co., Ltd.); DN-483 (Dow Chemical Co., Ltd.); YDPN-641, YDPN-638A80, YDPN-638, YDPN-637, YDPN-644, and YDPN-631 (Kukdo Chemical Co., Ltd.); an ortho cresol novolac epoxy resin such as YDCN-500-1P, YDCN-500-2P, YDCN-500-4P, YDCN-500-5P, YDCN-500-7P, YDCN-500-8P, YDCN-500-10P, YDCN-500-80P, YDCN-500-80PCA60, YDCN-500-80PBC60, YDCN-500-90P, and YDCN-500-90PA75 (Kukdo Chemical Co., Ltd.); EOCN-102S, EOCN-103S, EOCN-104S, EOCN-1012, EOCN-1025, and EOCN-1027 (Nippon Kayaku Co., Ltd.); YDCN-701, YDCN-702, YDCN-703, and YDCN-704 (Tohto Kasei Co., Ltd.) and EPICLON N-665-EXP (Dainippon Ink and Chemicals, Inc.); a bisphenol novolac epoxy resin such as KBPN-110, KBPN-120, and KBPN-115 (Kukdo Chemical Co., Ltd.); a multifunctional epoxy resin such as EPON 1031S (Sanho Chemical Co., Ltd.); Araldite 0163 (Swiss Ciba Specialty Chemicals (Ciba Specialty Chemicals Co., Ltd.)); DENACOL EX-611, DENACOL EX-614, DENACOL EX-614B, DENACOL EX-622, DENACOL EX-512, DENACOL EX-521, DENACOL EX-421, DENACOL EX-411, and DENACOL EX-321 (Nagase ChemteX Corporation) and EP-5200R, KD-1012, EP-5100R, KD-1011, KDT-4400A70, KDT-4400, YH-434L, YH-434, and YH-300 (Kukdo Chemical Co., Ltd.); an amino epoxy resin such as EPIKOTE 604 (Sanho Chemical Co., Ltd.), YH-434 (Tohto Kasei Co., Ltd.), TETRAD-X, and TETRAD-C (Mitsubishi Gas Chemical Co., Inc.) and ELM-120 (Sumitomo Chemical Co., Ltd.); a heterocyclic ring-containing epoxy resin such as PT-810 (Ciba Specialty Chemicals); a substituted epoxy resin such as ERL-4234, ERL-4299, ERL-4221, and ERL-4206 (UCC); and a naphthol epoxy resin such as EPICLON HP-4032, EPICLON HP-4032D, EPICLON HP-4700, and EPICLON 4701 (Dainippon Ink and Chemicals, Inc.). The solid epoxy resins can be used alone or in a combination of two or more.

The liquid epoxy resin refers to an epoxy resin in the liquid state at room temperature (25° C.). In an embodiment, the liquid epoxy resin can have a melting point (Tm) of about −70° C. to about 0° C., preferably about −50° C. to about −10° C. Moreover, the epoxy equivalent of the liquid epoxy resin is, for instance, 100 g/eq to 1500 g/eq, preferably 150 g/eq to 800 g/eq, and more preferably 150 g/eq to 400 g/eq. Specifically, when the epoxy equivalent of the liquid epoxy resin is within the above range, the conductive paste of the invention can be ensured to have good adhesion and high heat resistance after solidifying, and the glass transition temperature of the conductive paste can be maintained at the same time.

Moreover, the weight-average molecular weight (Mw) of the liquid epoxy resin is, for instance, 100 g/mol to 3000 g/mol. Specifically, when the weight-average molecular weight of the liquid epoxy resin is within the above range, the conductive paste of the invention can be ensured to have good fluidity.

The liquid epoxy resin of the invention can include a bisphenol A epoxy resin such as NPEL-127E and NPEL-128E (Nan Ya Plastics Corporation), a bisphenol F epoxy resin, an epoxy resin having three or more functions, a rubber-modified epoxy resin, a urethane-modified epoxy resin, an acrylic-modified epoxy resin, and/or a photosensitive epoxy resin. In one embodiment, the liquid epoxy resin preferably is a bisphenol A epoxy resin. The liquid epoxy resins can be used alone or in a combination of two or more.

To obtain a conductive paste having a suitable viscosity, in an embodiment, the solid epoxy resin can be used alone and a solvent can be used to adjust the viscosity thereof; in another embodiment, the solid epoxy resin, the liquid epoxy resin, and the solvent can also be used in combination. When the solid epoxy resin and the liquid epoxy resin are used in combination, the weight ratio of the solid epoxy resin to the liquid epoxy resin is, for instance, 9/1 to 1/9.

The solvent used in the invention is preferably any solvent having a boiling point within a range of 140° C. to 220° C. Specifically, when the boiling point of the solvent falls within the above range, it may be prevent the issues of poor printing characteristics or operation caused by a viscosity surge of the conductive paste due to solvent volatilization during paste preparing process and/or screen printing process.

In an embodiment, the solvent preferably includes a ketone solvent, an ether solvent, and an acetate solvent. The solvents can be used alone or in a combination of two or more. A specific example of the ketone solvent can include cyclohexanone. Specific examples of the ether solvent can include ethylene glycol monomethyl ether, ethylene glycol monoethyl ether, ethylene glycol monopropyl ether, ethylene glycol monobutyl ether, ethylene glycol monophenyl ether, ethylene glycol dimethyl ether, ethylene glycol diethyl ether, ethylene glycol dipropyl ether, ethylene glycol dibutyl ether, ethylene glycol diphenyl ether, diethylene glycol monomethyl ether, diethylene glycol monoethyl ether, diethylene glycol monopropyl ether, diethylene glycol monobutyl ether, diethylene glycol monophenyl ether, diethylene glycol dimethyl ether, diethylene glycol diethyl ether, diethylene glycol dipropyl ether, diethylene glycol dibutyl ether, diethylene glycol diphenyl ether, and propylene glycol monomethyl ether. Specific examples of the acetate solvent include ethylene glycol monoacetate, ethylene glycol monomethyl ether acetate, ethylene glycol monoethyl ether acetate, ethylene glycol monopropyl ether acetate, ethylene glycol monobutyl ether acetate (2-butoxyethyl acetate, 2-BXA), ethylene glycol monophenyl ether acetate, ethylene glycol diacetate, diethylene glycol monomethyl acetate, diethylene glycol monoethyl ether acetate (DGMEA), diethylene glycol monobutyl ether acetate, diethylene glycol diacetate, propylene glycol monomethyl ether acetate, and propylene glycol diacetate.

Moreover, the solvent of the invention is preferably at least one selected from diethylene glycol dimethyl ether, ethylene glycol monobutyl ether, ethylene glycol monomethyl ether acetate, ethylene glycol monoethyl ether acetate, 2-BXA, DGMEA, propylene glycol monomethyl ether acetate, and propylene glycol diacetate.

The latent curing agent used in the invention can be a compound that is an insoluble solid in the epoxy resin at room temperature (25° C.) and has the function of a curing promoter after being dissolved by heating.

In an embodiment, the latent curing agent includes an imidazole compound as the latent curing agent that is solid at room temperature, a solid dispersion type amine-epoxy adduct as the latent curing agent, such as a reaction product of an amine compound and an epoxy compound, or a solid dispersion type amine-urea adduct as the latent curing agent, such as a reaction product of an amine compound and an isocyanate compound or a urea compound.

Examples of the imidazole compound used as the latent curing agent of the invention include, for instance, 2-heptadecylimidazole, 2-phenyl-4,5-bishydroxymethylimidazole, 2-undecylimidazole, 2-phenyl-4-methyl-5-hydroxymethylimidazole, 2-methylimidazole, 2-phenylimidazole, 2-phenyl-4-methylimidazole, 1-cyanoethyl-2-phenylimidazole, 1-cyanoethyl-2-methylimidazole-trimellitate, 1-cyanoethyl-2-phenylimidazole-trimellitate, N-(2-methylimidazolyl-1-ethyl)urea, N,N'-(2-methylimidazolyl-(1)-ethyl)-adipolydiamide, but is not limited thereto.

Examples of the epoxy compound in the solid dispersion type amine-epoxy adduct as the latent curing agent of the invention include a polyglycidyl ether obtained by the reaction of a polyhydric phenol such as bisphenol A, bisphenol F, catechol or resorcinol or a polyhydric alcohol such as glycerol or polyethylene glycol with epichlorohydrin; a glycidyl ether ester obtained by the reaction of a hydroxycarboxylic acid such as p-hydroxybenzoic acid or β-hydroxynaphthoic acid with epichlorohydrin; a polyglycidyl ester obtained by the reaction of a polycarboxylic acid such as phthalic acid or terephthalic acid with epichlorohydrin; a glycidyl amine compound obtained by the reaction of, for instance, 4,4'-diaminodiphenylmethane or m-aminophenol with epichlorohydrin; a polyfunctional epoxy compound such as an epoxidized phenolic novolac resin, an epoxidized cresol novolac resin, or an epoxidized polyolefin; and a monofunctional epoxy compound such as butyl glycidyl ether, phenyl glycidyl ether, or glycidyl methacrylate, but is not limited thereto.

Moreover, the latent curing agent used in the invention can also be a commercial product, and specific examples thereof include, for instance, AMICURE PN-23 (Ajinomoto Co., Inc.), AMICURE PN-H (Ajinomoto Co., Inc.), NOVACURE HX-3742 (Asahi Kasei Co.), NOVACURE HX-3721 (Asahi Kasei Co.), FUJICURE FXE-1000 (Fuji Chemical Industry Co., Ltd), FUJICURE FXR-1030 (Fuji Chemical Industry Co., Ltd), but is not limited thereto.

In an embodiment, the content of the latent curing agent is, for instance, 0.3 wt % to 5 wt %, preferably 0.5 wt % to 2 wt %. Specifically, when the content of the latent curing agent is greater than or equal to 0.3 wt %, the conductive paste can have better hardness after solidifying. When the content of the latent curing agent is less than or equal to 5 wt %, the storage stability of the conductive paste can be ensured.

The flaky metal powder surface-treated by saturated fatty acid and the flaky metal powder surface-treated by unsaturated fatty acid of the invention are, for instance, each independently silver, copper, or an alloy thereof, preferably silver. In the invention, "flaky" indicates that the size of one direction (such as a thickness direction) in three directions perpendicular to one another (defined as a length direction, a width direction, and a thickness direction in the present text) is about less than or equal to ½ of the maximum value of the size of each of the other two directions (i.e., the length direction and the width direction), and is preferably in a range between 1/50 to 1/5.

In an embodiment, the flaky metal powder surface-treated by saturated fatty acid and the flaky metal powder surface-treated by unsaturated fatty acid can be flaky metal powders of the same metal treated by different surface treatments; in other embodiments, it may be utilized different metal powders to form the flaky metal powder surface-treated by saturated fatty acid and the flaky metal powder surface-treated by unsaturated fatty acid, respectively.

In an embodiment, the saturated fatty acid is, for instance: heptanoic acid, octanoic acid, nonanoic acid, decanoic acid, undecanoic acid, lauric acid, tridecyl acid, myristic acid, pentadecanoic acid, palmitic acid, heptadecanoic acid, stearic acid, nonadecanoic acid, eicosanoic acid, or docosanoic acid. In an embodiment, the flaky metal powder surface-treated by saturated fatty acid is, for instance, a commercial product selected from: LCP-267, KP-75, KP-80, KP-84, LCP-1-19SFA, LCP-1-19SFS, LCP-1-19SM, LCP-1-19VS, LCP-1-19VSH, LCP-1-19VSS, LCP-1-36, LCP-120, LCP-270, and LCP-701 (Ames Goldsmith Corp.), and SA-0201, SA-2831, and SA-0635 (Metalor Technologies).

In an embodiment, the unsaturated fatty acid is, for instance, acrylic acid, crotonic acid, methacrylic acid, undecenoic acid, oleic acid, elaidic acid, docosenoic acid, brassidic acid, erucic acid, sorbic acid, linolenic acid, arachidonic acid, or nervonic acid. In an embodiment, the flaky metal powder surface-treated by unsaturated fatty acid is, for instance, a commercial product selected from: 12XJ, 22XJ, SFA-AB, SF-ABJ, SF-2J, SF-3, SF-3J, SF-4, SF-5, SF-5H, SF-6, and MBT-579 (Ames Goldsmith Corp.), and AA-0014, AA-2043, AB-0022, AB-0222, AA-3462, AA-0023, AA-0909, AA-192N, AA-4703, AA-0005, AA-0707, AA-1831, AA-1832, AA-4091, AA-40736, AC-4048, AA-0981, AA-0101, AC 2594, P629-3, and P629-4 (Metalor Technologies).

In an embodiment of the invention, the tap density of each of the flaky metal powder surface-treated by saturated fatty acid and the flaky metal powder surface-treated by unsaturated fatty acid is, for instance, 1.1 g/cm$^3$ to 5.0 g/cm$^3$, and the specific surface area of each of the flaky metal powder surface-treated by saturated fatty acid and the flaky metal powder surface-treated by unsaturated fatty acid is, for instance, 0.5 m$^2$/g to 2.6 m$^2$/g. Moreover, the average particle diameter D50 of each of the flaky metal powder surface-treated by saturated fatty acid and the flaky metal powder surface-treated by unsaturated fatty acid is, for instance, 0.5 μm to 50 μm, preferably 0.5 μm to 20 μm. The "average particle diameter (D50)" recited here is a value obtained with the Coulter method by using the MultiSizer-3 made by Beckman Coulter, Inc. Specifically, D* represents the particle diameter at *% in the cumulative distribution. Using D50 as an example: D50 represents a particle diameter (μm) at 50% in the cumulative distribution; that is D50 splits the cumulative distribution with half having diameters above and half having diameters below this D50 diameter. D50 is usually used to represent an average particle diameter of a sample.

More specifically, when the average particle diameter D50 of each of the flaky metal powder surface-treated by saturated fatty acid and the flaky metal powder surface-treated by unsaturated fatty acid is less than 0.5 contact resistance between the flaky metal powders cannot be reduced. As a result, the conductivity of the formed conductive pattern is reduced. Moreover, when the average particle diameter D50 of each of the flaky metal powder surface-treated by saturated fatty acid and the flaky metal powder surface-treated by unsaturated fatty acid is greater than 50 the issue of the flaky metal powders blocking the screen mesh results when performing screen printing. As a result, poor printing phenomenon such as blurry printed pattern or disconnection can occur, thereby affecting precision.

Moreover, in the present embodiment, the flaky metal powder surface-treated by saturated fatty acid and the flaky metal powder surface-treated by unsaturated fatty acid are preferably used in combination. When the flaky metal powder surface-treated by saturated fatty acid and the flaky metal powder surface-treated by unsaturated fatty acid are used in combination, the weight ratio (saturated/unsaturated) of the flaky metal powder surface-treated by saturated fatty acid to the flaky metal powder surface-treated by unsaturated fatty acid is, for instance, 1/2 to 1/9.

Moreover, the conductive paste of the invention can further include an additive when needed. In particular, the content of the additive with respect to the epoxy resin is 0.1 to 30 parts by weight. In the present embodiment, the additive includes a thixotropic agent, a silane coupling agent, a dispersant, a leveling agent, or a combination thereof. However, the invention is not limited to the disclosed contents. Those having ordinary skill in the art should know that, additives having different functions, such as a defoamer, can be added according to actual requirement.

In an embodiment, a thixotropic agent can be added to adjust the thixotropy or viscosity of the conductive paste. In an embodiment, the content of the thixotropic agent with respect to the epoxy resin is, for instance, 5 to 20 parts by weight.

Moreover, the thixotropic agent may be an organic thixotropic agent or a inorganic thixotropic agent. Examples of the organic thixotropic agent include ethyl cellulose, hydroxypropyl cellulose, acrylic resin, fatty amide wax, oxidized polyethylene, amine salt of polyester polymer, salt of linear polyamine amide and acid polyester polymer, amide solution of polycarboxylic acid, alkyl sulfonate, alkyl allyl sulfonate, colloidal ester, polyester resin, phenol resin, melamine resin, epoxy resin, urethane resin, polyimide resin, and a combination thereof. Examples of the inorganic thixotropic agent include, for instance, calcium stearate, zinc stearate, aluminum stearate, aluminum oxide, zinc oxide, magnesium oxide, glass, diatomaceous earth, titanium oxide, zirconium oxide, silicon dioxide, talc, mica, feldspar, kaolinite (kaolin clay), pyrophyllite (pyrophyllite clay), sericite, bentonite, smectite, vermiculite (such as montmorillonite, beidellite, nontronite, and soapstone), organobentonite, and organic montmorillonite.

As the thixotropic agent, it may use a commercial product. Examples of organic thixotropic agent commercial products include, for instance, SELNY-HPC-H, HPC-M, HPC-L, HPC-SL, and HPC-SSL (Nippon Soda Co., Ltd.); the DIYANAL BR series (Mitsubishi Rayon Co., Ltd.); Dispalone #6900-20X, Dispalone #4200, Dispalone KS-873N, and Dispalone #1850 (Kusumoto Chemicals, Ltd.); BYK-E405, and BYK-E410 (BYK Chemie Japan Corporation); Primal RW-12W (Rohm and Haas Company); and A-S-AT-20S, A-S-AT-350F, A-S-AD-10A, and A-S-AD-160 (Itoh Oil Chemicals Co., Ltd.). Examples of inorganic thixotropic agent commercial products include, for instance, Crown Clay, Bages Clay #60, Bages Clay KF, and Optiwhite (Shiraishi Kogyo Kaisha, Ltd.); Kaolin JP-100, NN Kaolin Clay, ST Kaolin Clay, and Hardsil (Tsuchiya Kaolin Industry Ltd.); ASP-072, Satenton Plus, TRANSLINK 37, and Highdrasdelami NCD (Engelhard Corporation); SY Kaolin, OS CLAY, HA CLAY, and MC HARD CLAY (Marco Calcium Co., Ltd.); Rusentite SWN, Rusentite SAN, Rusentite STN, Rusentite SEN, and Rusentite SPN (Copchemical Corporation); Aerosil 300 (Degussa Corporation); Smecton (Cunimina Industries); Bengel, Bengel FW, S Ben, S Ben 74, Oruganite, and Oruganite T (Hojun Inc.); Hodaka print, Oluben, 250M, Benton 34, and Benton38 (Wilbur-Ellis Corporate); and Laponite, Laponite RD, and Laponite RDS (Japan Silica Industrial Co., Ltd.).

In an embodiment, to increase the adhesion between the conductive paste and the substrate, a silane coupling agent can be added. In particular, based on 100 parts by weight of the epoxy resin, the content of the silane coupling agent is preferably 0.5 parts by weight to 25 parts by weight, and more preferably 2.5 parts by weight to 15 parts by weight. Specifically, based on 100 parts by weight of the epoxy resin, when the content of the silane coupling agent is greater than or equal to 0.5 parts by weight, the conductive paste can have better adhesion. Based on 100 parts by weight of the epoxy resin, when the content of the silane coupling agent is less than or equal to 25 parts by weight, the balance between non-exudation and adhesion reliability of the conductive paste can be ensured.

Moreover, the silane coupling agent preferably includes a trialkoxysilane compound or a methyl dialkoxysilane compound, and specific examples thereof include, for instance, γ-glycidoxypropylmethyldimethoxysilane, γ-glycidoxypropyltrimethoxysilane, γ-glycidoxypropylmethyldiethoxysilane, γ-glycidoxypropyltriethoxysilane, γ-aminopropylmethyldimethoxysilane, γ-aminopropyltrimethoxysilane, γ-aminopropylmethyldiethoxysilane, γ-aminopropyltriethoxysilane, N-aminoethyl-γ-aminopropylmethyldimethoxysilane, N-aminoethyl-γ-aminopropyltrimethoxysilane, N-aminoethyl-γ-aminopropyltriethoxysilane, N-phenyl-γ-aminopropyltrimethoxysilane, N-phenyl-γ-aminopropyltriethoxysilane, N-phenyl-γ-aminopropylmethyldimethoxysilane, N-phenyl-γ-aminopropylmethyldiethoxysilane, γ-mercaptopropylmethyldimethoxysilane, γ-mercaptopropyltrimethoxysilane, isocyanatopropylmethyldiethoxysilane, and γ-isocyanatopropyltriethoxysilane. In particular, γ-glycidoxypropyltriethoxysilane, γ-glycidoxypropylmethyldimethoxysilane, γ-glycidoxypropyltrimethoxysilane and γ-glycidoxypropylmethyldiethoxysilane are, for instance, preferred. An example of a commercial product for the silane coupling agent is, for instance, KBM-403 (Shin-Etsu Chemical Co., Ltd.).

In an embodiment, to increase the dispersion of the flaky metal powders in the conductive paste, a dispersant can be added. In particular, based on 100 parts by weight of the epoxy resin, the content of the dispersant is preferably 10 parts by weight to 30 parts by weight, and more preferably 15 parts by weight to 25 parts by weight. Specifically, based on 100 parts by weight of the epoxy resin, when the content of the dispersant is greater than or equal to 10 parts by weight, the flaky metal powders can have better dispersion. However, based on 100 parts by weight of the epoxy resin, when the content of the dispersant is greater than or equal to 30 parts by weight, the viscosity performance of the conductive paste is affected.

In an embodiment, a dispersant having an amine value can be used, and the dispersant is, for instance, a commercial product selected from: Disper BYK 102, Disper BYK 160, Disper BYK 161, Disper BYK 162, Disper BYK 2163, Disper BYK 2164, Disper BYK 166, Disper BYK 167, Disper BYK 168, Disper BYK 2000, Disper BYK 2050, Disper BYK 2150, Disper BYK 2155, Disper BYK LPN6919, Disper BYK LPN21116, Disper BYK LPN21234, Disper BYK 9075, and Disper BYK 9077 (BYK Chemie); and EFKA 4015, EFKA 4020, EFKA 4046, EFKA 4047, EFKA 4050, EFKA 4055, EFKA 4060, EFKA 4080, EFKA 4300, EFKA 4330, EFKA 4340, EFKA 4400, EFKA 4401, EFKA 4402, EFKA 4403, and EFKA 4800 (BASF).

In an embodiment, a leveling agent can be added to reduce the surface tension of the conductive paste such that the conductive paste has a smooth surface. Based on 100 parts by weight of the epoxy resin, the content of the leveling agent is, for instance, preferably 3 parts by weight to 15 parts by weight. When the amount of the leveling agent added is not enough, the effect thereof is insignificant; however, if too much is added, for instance, more than 15 parts by weight, then the conductivity of the conductive paste is reduced. The leveling agent preferably includes a silicone oil, and examples thereof include, for instance: dimethyl silicone oil, phenyl methyl silicone oil, alkyl aryl-modified silicone oil, fluorine silicon oil, polyether-modified silicone oil, fatty acid ester-modified silicone oil, methyl hydrogen silicone oil, silanol group-containing silicone oil, alkoxy group-containing silicone oil, phenol group-containing silicone oil, methacrylic acid-modified silicone oil, amino-group-modified silicone oil, carboxylic acid-modified silicone oil, carbitol-modified silicone oil, epoxy group-modified silicone oil, mercapto group-modified silicone oil, fluorine-modified silicone oil, and polyether-modified silicone oil.

Moreover, the leveling agent used can also be a commercial product. Examples of commercial products suitable to be used as the leveling agent include, for instance: SH200-100cs, SH28PA, SH29PA, SH30PA, ST83PA, ST80PA, ST97PA, and ST86PA (Toray Dow Corning Silicon); and BYK-302, BYK-307, BYK-320, BYK-330, BYK-333, and BYK-392 (BYK Japan).

In the following, the characteristics of the conductive paste and the conductive pattern formed by the conductive paste of the invention are described in detail with embodiments. However, the following embodiments are not intended to limit the invention.

Preparation of Conductive Paste

Experiment 1

7 wt % NPEL-127E (liquid epoxy resin), 2 wt % BE504H (solid epoxy resin), 9.99 wt % DGMEA, and 7.62 wt % 2-BXA were added to a reaction device provided with mechanical stirring. After NPEL-127E and BE504H were uniformly dissolved, 1.41 wt % of the latent curing agent FXR-1030, 14.4 wt % of the flaky metal powder surface-treated by saturated fatty acid KP-75 (D50=9.7 μm, tap density-2 g/cm$^3$, specific surface area=1.85 m$^2$/g), and 57.58 wt % of the flaky metal powder surface-treated by unsaturated fatty acid AA-40736 (D50=2.9 tap density=2 g/cm$^3$, specific surface area=2.05 m$^2$/g) were added. Next, after each of the above materials was stirred, the materials were uniformly dispersed with a tri-roller machine.

Experiment 2

The difference between experiment 2 and experiment 1 is: when the latent curing agent FXR-1030, the flaky metal powder surface-treated by saturated fatty acid KP-75, and the flaky metal powder surface-treated by unsaturated fatty acid AA-40736 were added, the dispersant Disper BYK 2000 was added at the same time. The detailed amount of each component added is as shown in Table 1. Moreover, experiment 2 was prepared in the same manner as experiment 1.

Experiment 3

The difference between experiment 3 and experiment 1 is: when the latent curing agent FXR-1030, the flaky metal powder surface-treated by saturated fatty acid KP-75, and the flaky metal powder surface-treated by unsaturated fatty acid AA-40736 were added, the thixotropic agent Aerosil 300 was added at the same time. The detailed amount of each component added is as shown in Table 1. Moreover, experiment 3 was prepared in the same manner as experiment 1.

Experiment 4

The difference between experiment 4 and experiment 1 is: when NPEL-127E (liquid epoxy resin), BE504H (solid epoxy resin), DGMEA, and 2-BXA were added, the silane coupling agent KBM-403 was added at the same time. The detailed amount of each component added is as shown in Table 1. Moreover, experiment 4 was prepared in the same manner as experiment 1.

Experiment 5

The difference between experiment 5 and experiment 1 is: when the latent curing agent FXR-1030, the flaky metal powder surface-treated by saturated fatty acid KP-75, and the flaky metal powder surface-treated by unsaturated fatty acid AA-40736 were added, the thixotropic agent BYK-E410 was added at the same time. The detailed amount of each component added is as shown in Table 1. Moreover, experiment 5 was prepared in the same manner as experiment 1.

Experiment 6

The difference between experiment 6 and experiment 5 is: when NPEL-127E (liquid epoxy resin), BE504H (solid epoxy resin), DGMEA, and 2-BXA were added, the silane coupling agent KBM-403 was added at the same time. The detailed amount of each component added is as shown in Table 1. Moreover, experiment 6 was prepared in the same manner as experiment 5.

Experiment 7

The difference between experiment 7 and experiment 1 is: in experiment 7, the solid epoxy resins BE509 and JER1256 different than the solid epoxy resin BE504H were used, and the liquid epoxy resin was not used; the flaky metal powder surface-treated by saturated fatty acid KP-80 (D50=5.5 μm, tap density=1.2 g/cm$^3$, specific surface area=1.81 m$^2$/g) different than the flaky metal powder surface-treated by saturated fatty acid KP-75 was used; in addition to the flaky metal powder surface-treated by unsaturated fatty acid AA-40736, the flaky metal powder surface-treated by unsaturated fatty acid MBT-579 (D50=2.8 μm, tap density=3 g/cm³, specific surface area=1.17 m²/g) was also used; when the solid epoxy resins BE509 and JER1256 and the solvents DGMEA and 2-BXA were added, the silane coupling agent KBM-403 and the leveling agent BYK-320 were added at the same time; and after the flaky metal powder surface-treated by saturated fatty acid KP-80 and the flaky metal powders surface-treated by unsaturated fatty acid AA-40736 and MBT-579 were added and uniformly mixed, the latent curing agent FXR-1030 and the thixotropic agent BYK-E410 were added. The detailed amount of each component added is as shown in Table 1. Moreover, experiment 7 was prepared in the same manner as experiment 1.

Comparative Experiment 4 and Comparative Experiment 7

The difference between comparative experiment 4 and experiment 1 is: the flaky metal powder surface-treated by saturated fatty acid KP-75 is used alone in comparative experiment 4. The difference between comparative experiment 7 and experiment 1 is: the flaky metal powder surface-treated by unsaturated fatty acid AA-40736 is used alone in comparative experiment 7. The detailed amount of each component added in comparative experiment 4 and comparative experiment 7 is as shown in Table 2. Specifically, only the flaky metal powder surface-treated by saturated fatty acid KP-75 was added in comparative experiment 4, and only the flaky metal powder surface-treated by unsaturated fatty acid AA-40736 was added in comparative experiment 7. Moreover, comparative experiment 4 and comparative experiment 7 were both prepared in the same manner as experiment 1.

Comparative Experiment 5, Comparative Experiment 6, and Comparative Experiment 8

In comparison with comparative experiment 7, it is not to use the flaky metal powder surface-treated by unsaturated fatty acid AA-40736 but to use the flaky metal powders surface-treated by unsaturated fatty acid SF-2J (D50=1.5 μm, tap density-4.2 g/cm³, specific surface area-1.35 m²/g), MBT-579 (D50=2.8 μm, tap density-3 g/cm³, specific surface area=1.17 m²/g), and AC-4048 (D50=2.1 tap density-4.7 g/cm³, specific surface area=0.9 m²/g) in comparative experiments 5-6 and 8, respectively. The detailed amount of each component added in comparative experiment 5, comparative experiment 6, and comparative experiment 8 is as shown in Table 2. Specifically, the flaky metal powder surface-treated by unsaturated fatty acid SF-2J was used in comparative experiment 5, the flaky metal powder surface-treated by unsaturated fatty acid MBT-579 was used in comparative experiment 6, and the flaky metal powder surface-treated by unsaturated fatty acid AC-4048 was used in comparative experiment 8. Moreover, comparative experiment 5, comparative experiment 6, and comparative experiment 8 were all prepared in the same manner as comparative experiment 7.

Comparative Experiment 3

The difference between comparative experiment 3 and comparative experiment 7 is: when NPEL-127E (liquid epoxy resin), BE504H (solid epoxy resin), DGMEA, and 2-BXA were added, the silane coupling agent KBM-403 was added at the same time. Moreover, when the latent curing agent FXR-1030 and the flaky metal powder surface-treated by unsaturated fatty acid AA-40736 were added, the thixotropic agents Aerosil 300 and BYK-E410, the dispersant Disper BYK 2000, and the hardener dicyandiamide (DICY) were added at the same time. The detailed amount of each component added in comparative experiment 3 is as shown in Table 2. Moreover, comparative experiment 3 was prepared in the same manner as comparative experiment 7.

Comparative Experiment 2

The difference between comparative experiment 2 and comparative experiment 3 is: the flaky metal powder surface-treated by unsaturated fatty acid 12XJ (D50=1.6 μm, tap density=4.1 g/cm³, specific surface area=1.17 m²/g) different than the flaky metal powder surface-treated by unsaturated fatty acid AA-40736 was used. The detailed amount of each component added in comparative experiment 2 is as shown in Table 2. Moreover, comparative experiment 2 was prepared in the same manner as comparative experiment 3.

Comparative Experiment 1

The difference between comparative experiment 1 and comparative experiment 2 is: a globular silver powder AEP-1 (D50=1.1 μm, tap density=3.9 g/cm³, specific surface area=0.88 m²/g) was used. The detailed amount of each component added in comparative experiment 1 is as shown in Table 2. Moreover, comparative experiment 1 was prepared in the same manner as comparative experiment 2.

TABLE 1

|  |  | Experiment 1 | Experiment 2 | Experiment 3 | Experiment 4 |
|---|---|---|---|---|---|
| Epoxy resin (wt %) | NPEL-127E | 7.00 | 7.14 | 7.03 | 7.04 |
|  | BE504H | 2.00 | 2.04 | 2.01 | 2.01 |
|  | BE509 | — | — | — | — |
|  | JER1256 | — | — | — | — |
|  | Sum | 9.00 | 9.18 | 9.04 | 9.05 |
| Solvent (wt %) | DGMEA | 9.99 | 10.20 | 10.05 | 10.05 |
|  | 2-BXA | 7.62 | 5.71 | 7.15 | 7.14 |
|  | Sum | 17.61 | 15.91 | 17.20 | 17.19 |
| Latent curing agent (wt %) | FXR-1030 | 1.41 | 1.43 | 1.41 | 1.41 |
| Flaky metal powder surface-treated by saturated fatty acid (wt %) | KP-75 | 14.40 | 14.69 | 14.47 | 14.47 |
|  | KP-80 | — | — | — | — |
| Flaky metal powder surface-treated by unsaturated fatty acid (wt %) | AA-40736 | 57.58 | 58.78 | 57.88 | 57.89 |
|  | MBT-579 | — | — | — | — |

TABLE 1-continued

| | | | | | |
|---|---|---|---|---|---|
| Globular silver powder (wt %) | AEP-1 | — | — | — | — |
| Additive | Dispersant (g/100 g epoxy) | Disper BYK 2000 | — | 22.33 | — | — |
| | Silane coupling agent (g/100 g epoxy) | KBM-403 | — | — | — | 5.56 |
| | Thixotropic agent (g/100 g epoxy) | Aerosil 300 | — | — | 5.61 | — |
| | | BYK-E410 | — | — | — | — |
| | Leveling agent (g/100 g epoxy) | BYK-320 | — | — | — | — |

| | | Experiment 5 | Experiment 6 | Experiment 7 |
|---|---|---|---|---|
| Epoxy resin (wt %) | NPEL-127E | 7.07 | 4.07 | — |
| | BE504H | 2.02 | 6.10 | — |
| | BE509 | — | — | 0.77 |
| | JER1256 | — | — | 3.85 |
| | Sum | 9.09 | 10.17 | 4.62 |
| Solvent (wt %) | DGMEA | 10.10 | 10.16 | 16.44 |
| | 2-BXA | 6.68 | 5.08 | 1.02 |
| | Sum | 16.78 | 15.24 | 17.46 |
| Latent curing agent (wt %) | FXR-1030 | 1.42 | 1.42 | 1.07 |
| Flaky metal powder surface-treated by saturated fatty acid (wt %) | KP-75 | 14.54 | 18.29 | — |
| | KP-80 | — | — | 7.68 |
| Flaky metal powder surface-treated by unsaturated fatty acid (wt %) | AA-40736 | 58.16 | 54.88 | 19.22 |
| | MBT-579 | — | — | 49.95 |
| Globular silver powder (wt %) | AEP-1 | — | — | — |
| Additive | Dispersant (g/100 g epoxy) | Disper BYK 2000 | — | — | — |
| | Silane coupling agent (g/100 g epoxy) | KBM-403 | — | 6.00 | 13.39 |
| | Thixotropic agent (g/100 g epoxy) | Aerosil 300 | — | — | — |
| | | BYK-E410 | 11.11 | 10.00 | 23.09 |
| | Leveling agent (g/100 g epoxy) | BYK-320 | — | — | 4.62 |

TABLE 2

| | | Comparative experiment 1 | Comparative experiment 2 | Comparative experiment 3 | Comparative experiment 4 |
|---|---|---|---|---|---|
| Epoxy resin (wt %) | BE504H | 3.12 | 3.12 | 1.62 | 2.00 |
| | NPEL-127E | 8.14 | 8.14 | 6.51 | 7.00 |
| | DICY | 0.66 | 0.66 | 0.66 | — |
| | Sum | 11.92 | 11.92 | 8.79 | 9.00 |
| Solvent (wt %) | DGMEA | 10.42 | 10.42 | 12.50 | 10.00 |
| | 2-BXA | 3.12 | 3.12 | 4.17 | 7.60 |
| | Sum | 13.54 | 13.54 | 16.67 | 17.60 |
| Curing promoter (wt %) | FXR-1030 | 1.63 | 1.63 | 1.63 | 1.40 |
| Flaky metal powder surface-treated by saturated fatty acid (wt %) | KP-75 | — | — | — | 72.00 |
| Flaky metal powder surface-treated by unsaturated fatty acid (wt %) | 12XJ | — | 72.91 | — | — |
| | AA-40736 | — | — | 72.91 | — |
| | SF-2J | — | — | — | — |
| | MBT-579 | — | — | — | — |
| | AC-4048 | — | — | — | — |
| Globular silver powder (wt %) | AEP-1 | 72.91 | — | — | — |
| Additive | Dispersant (g/100 g epoxy) | Disper BYK 2000 | 2.0037 | 2.0084 | 2.01265 | — |
| | Silane coupling agent (g/100 g epoxy) | KBM-403 | 0.5 | 0.5 | 0.5078 | — |
| | Thixotropic agent (g/100 g epoxy) | Aerosil 300 | 0.5005 | 0.5084 | 0.50225 | — |
| | | BYK-E410 | 1.0042 | 1.0054 | 1.0123 | — |
| | | Sum | 1.5047 | 1.5138 | 1.51455 | — |

TABLE 2-continued

|  |  | Comparative experiment 5 | Comparative experiment 6 | Comparative experiment 7 | Comparative experiment 8 |
|---|---|---|---|---|---|
| Epoxy resin (wt %) | BE504H | 2.00 | 2.00 | 2.00 | 2.00 |
|  | NPEL-127E | 7.00 | 7.00 | 7.00 | 7.00 |
|  | DICY | — | — | — | — |
|  | Sum | 9.00 | 9.00 | 9.00 | 9.00 |
| Solvent (wt %) | DGMEA | 10.00 | 10.00 | 10.00 | 10.00 |
|  | 2-BXA | 7.60 | 7.60 | 7.60 | 7.60 |
|  | Sum | 17.60 | 17.60 | 17.60 | 17.60 |
| Curing promoter (wt %) | FXR-1030 | 1.40 | 1.40 | 1.40 | 1.40 |
| Flaky metal powder surface-treated by saturated fatty acid (wt %) | KP-75 | — | — | — | — |
| Flaky metal powder surface-treated by unsaturated fatty acid (wt %) | 12XJ | — | — | — | — |
|  | AA-40736 | — | — | 72.00 | — |
|  | SF-2J | 72.00 | — | — | — |
|  | MBT-579 | — | 72.00 | — | — |
|  | AC-4048 | — | — | — | 72.00 |
| Globular silver powder (wt %) | AEP-1 | — | — | — | — |
| Additive  Dispersant (g/100 g epoxy) | Disper BYK 2000 | — | — | — | — |
| Silane coupling agent (g/100 g epoxy) | KBM-403 | — | — | — | — |
| Thixotropic agent (g/100 g epoxy) | Aerosil 300 | — | — | — | — |
|  | BYK-E410 | — | — | — | — |
|  | Sum | — | — | — | — |

Fabrication of Conductive Pattern

Screen printing was performed on the conductive paste of each of experiment 1 to experiment 7 and the conductive paste of each of comparative experiment 1 to comparative experiment 8 to form 8 cm×2 cm block patterns, 300 μm×8 cm segment patterns, and circuit patterns having a linewidth/line space of 100 μm/100 μm on a glass substrate with a screen printing method. Next, the glass samples were placed in a furnace at 170° C. and dried for 3 minutes to obtain the conductive patterns.

In the following, the conductive paste of each of experiment 1 to experiment 7, the conductive paste of each of comparative experiment 1 to comparative experiment 8, and the block patterns, segment patterns, or circuit patterns formed by the conductive paste of each of experiment 1 to experiment 7 and the conductive paste of each of comparative experiment 1 to comparative experiment 8 were respectively tested and evaluated for the various properties listed. The result of each test is shown in Table 3 and Table 4. The methods of the tests are described in detail in the following text.

<Determination of Viscosity>

The viscosity (50 rpm) of each of the conductive pastes was measured at a rotational speed of 50 rpm with the CAP200+ of Brookfield at room temperature. A higher value in the table indicates that the viscosity (here, viscosity refers to dynamic viscosity) of the conductive paste is greater during screen printing.

The viscosity (5.0 rpm) of each of the conductive pastes was measured at a rotational speed of 5 rpm with the CAP200+ of Brookfield at room temperature. A higher value in the table indicates that the viscosity (here, viscosity refers to static viscosity) of the conductive paste is greater after screen printing, and that overflow occurs less readily. Moreover, in the table, the value of viscosity (5.0 rpm) is greater than the value of viscosity (50 rpm).

Moreover, in the present invention, the thixotropic index is defined as viscosity (5.0 rpm)/viscosity (50 rpm). Generally, the preferred thixotropic index of the conductive paste is between 3.5 and 12, and the greater value the better. Specifically, a higher value indicates that the viscosity during the screen printing process is low, thereby facilitating the printing process. After screen printing, the viscosity is high such that overflow does not readily occur.

<Pencil Hardness>

The hardness of the surface of each of the 8 cm×2 cm block patterns obtained after drying was measured. Generally, the pencil hardness specification of the conductive pattern formed by the conductive paste is preferably greater than or equal to H, more preferably greater than or equal to 2H.

<Adherence>

A cotton swab dipped in alcohol was used to wet the printing surface of each of the samples for 3 minutes. Next, under a pressure of 200 g, the samples were wiped back and forth 20 times, and then the samples were observed for visible peeling.

<Cross-Cut Adhesion Test>

In accordance to the method of JIS K5600, 100 squares of 10 squares×10 squares were cut out with a cutter on the surface of each of the 8 cm×2 cm block patterns. Next, tape 600 made by 3M Corporation was stuck onto each of the printing surfaces and then rapidly peeled off. Evaluation was carried out based on the number of remaining squares. NG was directly noted on the table if peeling phenomenon occurred.

<Conductivity Test>

Measurement was carried out with a multimeter, and if conduction was observed, then the volume resistivity was calculated. NG was directly noted on the table if insulation was observed.

<Calculation of Volume Resistivity>

In an environment of 25° C. and a humidity of 50%, the Loresta APMCP-T400 measuring device (made by Mitsubishi Chemical Corporation) was used to determine the surface resistance value of each of the 300 μm×8 cm segment patterns. Next, the volume resistivity was calculated through the determined surface resistance values and the film thicknesses. Volume resistivity (Ω·cm)=(surface resistivity: Ω/cm$^2$)×(film thickness: cm).

<Printing Characteristics>

The circuit patterns having a linewidth/line distance of 100 μm/100 μm formed on the glass samples were observed with an optical microscope. The printing characteristics of the conductive pastes were evaluated based on whether the formed circuit patterns had issues of poor printing such as burrs or blurring or whether the formed circuit patterns were close to the predetermined dimension. NG was directly noted on the table if issues of poor printing such as burrs or blurring occurred.

TABLE 3

|  | Experiment 1 | Experiment 2 | Experiment 3 | Experiment 4 |
| --- | --- | --- | --- | --- |
| Viscosity (50 rpm)mPas | 3255 | 2055 | 2175 | 2700 |
| Viscosity (5.0 rpm)mPas | 13050 | 11850 | 10500 | 11700 |
| Thixotropic index 5 rpm/50 rpm | 4.0 | 5.8 | 4.8 | 4.3 |
| Pencil hardness (0.5 kg) | ≥2H | ≥2H | ≥2H | ≥2H |
| Adherence (tape peeling) | No peeling | No peeling | No peeling | No peeling |
| Hundred cell adhesion | Good (100/100) | Good (100/100) | Good (100/100) | Good (100/100) |
| Volume resistivity (Ω-cm) | 7.82 × 10*−5 | 7.98 × 10*−5 | 9.08 × 10*−5 | 7.36 × 10*−5 |
| Screen printing characteristics | OK | OK | OK | OK |

|  | Experiment 5 | Experiment 6 | Experiment 7 |
| --- | --- | --- | --- |
| Viscosity (50 rpm)mPas | 3045 | 4185 | 16800 |
| Viscosity (5.0 rpm)mPas | 14550 | 47850 | 233250 |
| Thixotropic index 5 rpm/50 rpm | 4.8 | 11.4 | 13.75 |
| Pencil hardness (0.5 kg) | ≥2H | ≥2H | ≥2H |
| Adherence (tape peeling) | No peeling | No peeling | No peeling |
| Hundred cell adhesion | Good (100/100) | Good (100/100) | Good (100/100) |
| Volume resistivity (Ω-cm) | 4.96 × 10*−5 | 5.24 × 10*−5 | 2.56 × 10*−5 |
| Screen printing characteristics | OK | OK | OK |

TABLE 4

|  | Comparative experiment 1 | Comparative experiment 2 | Comparative experiment 3 | Comparative experiment 4 |
| --- | --- | --- | --- | --- |
| Viscosity (50 rpm)mPas | 1170 | 1710 | 6300 | 3450 |
| Viscosity (5.0 rpm)mPas | 2700 | 3000 | 6000 | 21300 |
| Thixotropic index 5 rpm/50 rpm | 2.3 | 1.75 | 0.95 | 6.2 |
| Pencil hardness (0.5 kg) | ≥2H | ≥2H | ≥2H | ≥2H |
| Adherence (tape peeling) | No peeling | No peeling | No peeling | — |
| Hundred cell adhesion | NG | NG | NG | — |
| Conductivity (multimeter) | NG | NG | NG | — |
| Volume resistivity (Ω-cm) | — | — | — | 5.184 × 10*−5 |
| Screen printing characteristics | NG | OK | OK | NG |

|  | Comparative experiment 5 | Comparative experiment 6 | Comparative experiment 7 | Comparative experiment 8 |
| --- | --- | --- | --- | --- |
| Viscosity (50 rpm)mPas | 750 | 720 | 2550 | 1470 |
| Viscosity (5.0 rpm)mPas | 4500 | 4200 | 12150 | 9000 |
| Thixotropic index 5 rpm/50 rpm | 6 | 5.8 | 4.8 | 6.12 |
| Pencil hardness (0.5 kg) | ≥2H | ≥2H | ≥2H | ≥2H |
| Adherence (tape peeling) | — | — | — | — |
| Hundred cell adhesion (glass) | — | — | — | — |
| Conductivity of ends of conductive wire measured with multimeter | — | — | — | — |
| Volume resistivity (Ω-cm) | 9.793 × 10*−5 | 7.831 × 10*−5 | 1.3814 × 10*−4 | 1.7276 × 10*−4 |
| Screen printing characteristics | NG | NG | OK | NG |

It can be known from Table 3 that, the conductive paste of each of experiment 1 to experiment 7 of the invention has good printing characteristics and can form a conductive pattern having high conductivity and good precision. Moreover, each of the formed conductive patterns has better surface hardness, adherence, and adhesion. On the contrary, from Table 4, it is clear that the conductive paste of each of comparative experiment 1 to comparative experiment 8 cannot have good printing characteristics and form a conductive pattern having high conductivity at the same time.

Specifically, the conductive paste of comparative experiment 1 cannot provide good conductivity since a globular silver powder was used. Moreover, the viscosity (5.0 rpm) thereof is too low, and therefore overflow readily occurs after screen printing is performed. As a result, the conductive paste of comparative experiment 1 does not have good printing characteristics. Moreover, comparative experiment 2, comparative experiment 3, comparative experiment 7, and comparative experiment 8 using the flaky metal powder surface-treated by unsaturated fatty acid alone also cannot provide good conductivity. In particular, the volume resistivity of each of comparative experiment 7 and comparative experiment 8 is too high, and therefore the conductivity of the circuits is poor.

Moreover, the conductive paste of each of comparative experiment 4, comparative experiment 5, comparative experiment 6, and comparative experiment 8 using the flaky metal powder surface-treated by saturated fatty acid or the flaky metal powder surface-treated by unsaturated fatty acid alone does not have good printing characteristics. It should be mentioned that, comparative experiment 4 used the flaky metal powder surface-treated by saturated fatty acid KP-75 having greater average particle diameter, and therefore showed good conductivity (i.e., lower volume resistivity). However, aggregation phenomenon of uneven distribution of the metal powder particles is also readily generated thereby, and therefore the circuit pattern showed poor printing results such as burrs.

Based on the above, the conductive paste provided in the embodiments contains a flaky metal powder surface-treated by saturated fatty acid and a flaky metal powder surface-treated by unsaturated fatty acid. As a result, the conductive paste can have good printing characteristics, and a fine pattern having high conductivity and good precision can be formed. Moreover, the flaky metal powder surface-treated by saturated fatty acid and the flaky metal powder surface-treated by unsaturated fatty acid in the conductive paste provided in the embodiments are used in combination.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A conductive paste, comprising:
   an epoxy resin having a content of 3 wt % to 20 wt %;
   a solvent having a content of 10 wt % to 25 wt %;
   a latent curing agent having a content of 0.3 wt % to 5 wt %;
   a first flaky metal powder only surface-treated by saturated fatty acid having a content of 3.5 wt % to 35 wt %; and
   a second flaky metal powder only surface-treated by unsaturated fatty acid having a content of 35 wt % to 75 wt %;
   wherein each of the first flaky metal powder only surface-treated by saturated fatty acid and the second flaky metal powder only surface-treated by unsaturated fatty acid has an average particle diameter D50 of 0.5 μm to 20 μm, a tap density of 1.1 $g/cm^3$ to 5.0 $g/cm^3$, and a specific surface area of 0.5 $m^2/g$ to 2.6 $m^2/g$.

2. The conductive paste of claim 1, wherein the first flaky metal powder only surface-treated by saturated fatty acid and the second flaky metal powder only surface-treated by unsaturated fatty acid each independently comprise silver, copper, or an alloy thereof.

3. The conductive paste of claim 1, wherein the epoxy resin comprises a solid epoxy resin, a liquid epoxy resin, or a combination thereof.

4. The conductive paste of claim 3, wherein the solid epoxy resin and the liquid epoxy resin are used in combination and a weight ratio of the solid epoxy resin to the liquid epoxy resin is 9/1 to 1/9.

5. The conductive paste of claim 3, wherein an epoxy equivalent of the solid epoxy resin is 1000 g/eq to 20000 g/eq.

6. The conductive paste of claim 3, wherein a weight-average molecular weight of the solid epoxy resin is 5000 g/mol to 65000 g/mol.

7. The conductive paste of claim 3, wherein an epoxy equivalent of the liquid epoxy resin is 100 g/eq to 1500 g/eq.

8. The conductive paste of claim 3, wherein a weight-average molecular weight of the liquid epoxy resin is 100 g/mol to 3000 g/mol.

9. The conductive paste of claim 1, wherein a boiling point of the solvent is 140° C. to 220° C.

10. The conductive paste of claim 1, further comprising an additive, wherein based on 100 parts by weight of the epoxy resin, a content of the additive is 0.1 parts by weight to 30 parts by weight.

11. The conductive paste of claim 10, wherein the additive comprises a thixotropic agent, a silane coupling agent, a dispersant, a leveling agent, or a combination thereof.

12. The conductive paste of claim 11, wherein based on 100 parts by weight of the epoxy resin, a content of the silane coupling agent is 0.5 parts by weight to 25 parts by weight.

13. The conductive paste of claim 11, wherein based on 100 parts by weight of the epoxy resin, a content of the leveling agent is 3 parts by weight to 15 parts by weight.

* * * * *